US011906601B2

(12) United States Patent
Kammela

(10) Patent No.: US 11,906,601 B2
(45) Date of Patent: Feb. 20, 2024

(54) INTELLIGENT TRANSFORMER MONITORING SYSTEM

(71) Applicant: ISCIENTIFIC TECHSOLUTIONS LABS, Hyderabad (IN)

(72) Inventor: Narasimha Rao Kammela, Hyderabad (IN)

(73) Assignee: ISCIENTIFIC TECHSOLUTIONS LABS, Hyderabad (IN)

( * ) Notice: Subject to any disclaimer, the term of this patent is extended or adjusted under 35 U.S.C. 154(b) by 403 days.

(21) Appl. No.: 17/281,563

(22) PCT Filed: Sep. 25, 2019

(86) PCT No.: PCT/IN2019/050700
§ 371 (c)(1),
(2) Date: Mar. 30, 2021

(87) PCT Pub. No.: WO2020/075181
PCT Pub. Date: Apr. 16, 2020

(65) Prior Publication Data
US 2021/0364577 A1 Nov. 25, 2021

(30) Foreign Application Priority Data
Oct. 12, 2018 (IN) .............................. 201841038912

(51) Int. Cl.
*G01R 31/62* (2020.01)
*G01S 19/01* (2010.01)
(Continued)

(52) U.S. Cl.
CPC .............. *G01R 31/62* (2020.01); *G01S 19/01* (2013.01); *H02H 1/0007* (2013.01); *H02H 7/04* (2013.01); *H04L 67/125* (2013.01)

(58) Field of Classification Search
CPC ...... G01R 31/62; G01S 19/01; H02H 1/0007; H02H 7/04; H02H 5/04; H04L 67/125;
(Continued)

(56) References Cited

U.S. PATENT DOCUMENTS 9,214,836 B2 * 12/2015 Flammer, III ...... H04L 41/0686
2010/0033277 A1 * 2/2010 Davis ................ H02J 13/00002
335/205

(Continued)

*Primary Examiner* — Giovanni Astacio-Oquendo

(57) ABSTRACT

An intelligent transformer monitoring system to detect and monitor random failures in distribution transformers due to improper usage and poor maintenance is provided. The intelligent transformer monitoring system includes a GSM-GPRS, a measurement and instrumentation module, a control relay module, a Trivector energy measurement, and a GPS module. The GSM-GPRS includes microcontroller along with GSM_GPRS modem in order to execute remote communication on GSM-GPRS. The Measurement and Instrumentation module includes eleven temperature measurement channels with 8-digital temperature sensors and 3-RTD. The control relay module includes 4 SPDT relays to execute output controls such as load trip and cooling motor etc. The GPS module acquires the latitude, longitude and time data from the satellite for location sharing. The Power supply module is an AC/DC SMPS power supply to convert 240V/415V AC to 12 VDC for the intelligent transformer monitoring system.

8 Claims, 5 Drawing Sheets

(51) Int. Cl.
*H02H 1/00* (2006.01)
*H02H 7/04* (2006.01)
*H04L 67/125* (2022.01)

(58) Field of Classification Search
CPC ...... Y02E 60/00; Y02E 40/30; H02J 2310/12; H02J 3/1807; H02J 13/00024; Y02B 90/20; Y04S 40/126
USPC .................................. 324/547, 546, 537, 500
See application file for complete search history.

(56) References Cited

U.S. PATENT DOCUMENTS

| | | | | |
|---|---|---|---|---|
| 2014/0077820 A1* | 3/2014 | Al-Ghannam | ......... | G01R 31/58 324/522 |
| 2014/0244166 A1* | 8/2014 | Klancher | ............. | G08B 21/185 701/515 |
| 2019/0271731 A1* | 9/2019 | Miron | .................. | G01R 15/142 |

* cited by examiner

INTELLIGENT TRANSFORMER MONITORING SYSTEM

BACKGROUND

Technical Field

The embodiments herein generally relate to transformers, and more particularly, to an intelligent transformer monitoring system that monitors and detects possible random failures in a Low Tension (LT) distribution transformers which may be caused by an improper usage and poor maintenance of the Low Tension (LT) distribution transformers.

Description of the Related Art

A Low Tension (LT) distribution transformer is a power electronic device used in many applications ranging from home use to industrial use. A power reliability of the Low Tension (LT) distribution is critical, since it directly affects production in the industrial use. The equipment such as the Low Tension (LT) distribution transformers which form a crucial part of substation are expensive. The cost of interruption in the Low Tension (LT) distribution is also expensive. Each of the Low Tension (LT) distribution transformers has a plurality of electrical, electronic, mechanical, fluid-based components which forms a working Low Tension (LT) distribution. Maintenance of the components is a crucial aspect in order to maintain a sustainable environment without glitches and to avoid interruptions which could have cascaded catastrophic effects in and around the power industry environment, depending upon the time for which interruptions occur.

To avoid breakdown of the Low Tension (LT) distribution transformers in crucial environment, it is necessary that a health of the Low Tension (LT) distribution transformer be maintained continuously which is usually done by means of regular servicing by a field personnel who is in charge of timely scheduled maintenance of the Low Tension (LT) distribution transformer which is risky.

Accordingly, there remains a need for an intelligent transformer monitoring system which can detect and monitor random failures in a Low Tension (LT) distribution transformers which may be caused by an improper usage and a poor maintenance the Low Tension (LT) distribution transformer.

SUMMARY

This summary is provided to introduce a selection of concepts in a simplified form that is further described below in the Detailed Description. This Summary is not intended to identify key or essential features of the claimed subject matter, nor is it intended to be used as an aid in determining the scope of the claimed subject matter.

In an aspect, an intelligent transformer monitoring system is disclosed. The intelligent transformer monitoring system includes one or more sensors, a Global System for Mobile Communications GSM—general packet radio services (GSM-GPRS) modem, a server, a Wi-Fi module, and a control relay module. The one or more sensors is communicatively connected to a low tension (LT) distribution transformer and is configured to capture live data of the low tension (LT) distribution transformer. The one or more sensors includes a winding temperature sensor, an oil temperature sensor, a voltage and current measurement sensor, and an ambient temperature sensor. The live data is an instant parametric data acquired from the one or more sensors and measurement of electrical parameters of the low tension (LT) distribution transformer. The low tension (LT) distribution transformer is configured to couple with the winding temperature sensor. The winding temperature sensor captures the live data. The oil temperature sensor is mounted on the top of an oil level through an oil monitoring pocket provided on the low tension (LT) distribution transformer. The Global System for Mobile Communications GSM—general packet radio services (GSM-GPRS) modem includes a microcontroller along with a GSM-GPRS modem for establishing a remote communication to transmit the live data between the GSM-GPRS modem and a global positioning system (GPS) module of the low tension (LT) distribution transformer.

The global positioning system (GPS) module characterised in that includes a measurement and instrumentation module that is configured to acquire positional information including longitude and latitude coordinates, and time data of the low tension (LT) distribution transformer. The acquired longitude and latitude coordinates, and the time data is processed for an internal timing and a time tagging of the live data. The server that receives the live data with an exact positional information of the low tension (LT) distribution transformer based on a GPS Location of the low tension (LT) distribution transformer. The Wi-Fi module is configured as a local server. The Wi-Fi module acquires the live data from the one or more sensors and transmits the live data to an application browser on a user device when a user requests the intelligent transformer monitoring system for the live data of the low tension (LT) distribution transformer. The control relay module includes a single pole double throw (SPDT) relays to control a load trip and a cooling motor of the low tension (LT) distribution transformer.

In another aspect, a method of providing an intelligent transformer monitoring system is disclosed. The method includes receiving a real-time data from one or more sensors. The one or more sensors includes a winding temperature sensor, an oil temperature sensor, a voltage and current measurement sensor, and an ambient temperature sensor, analyzing the live data for abnormalities in the low tension (LT) distribution transformer, and alerting a contractor to shut down the low tension (LT) distribution transformer when the abnormalities is detected in the low tension (LT) distribution transformer.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
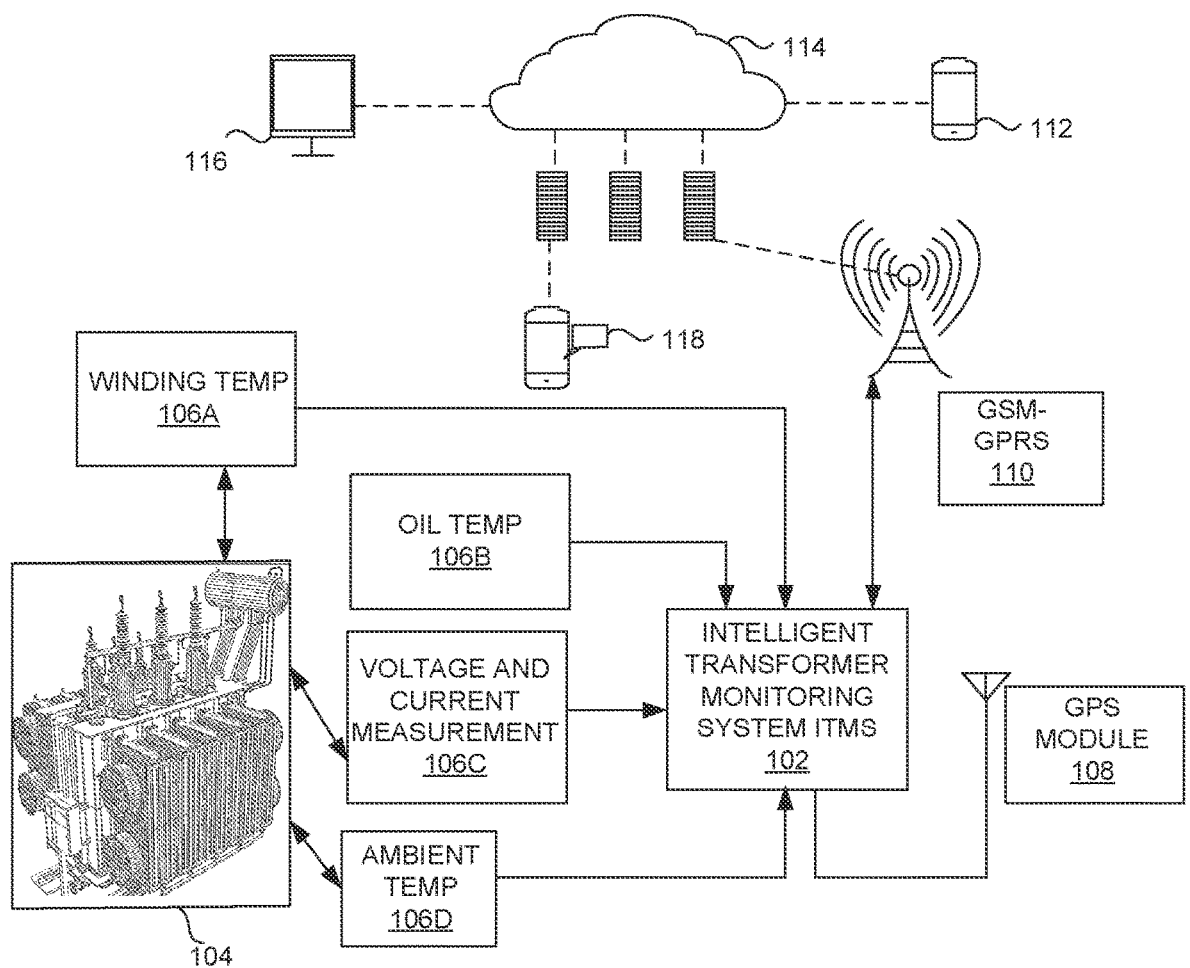
FIG. 1 is a block diagram that illustrates an intelligent transformer monitoring system according to some embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for an intelligent transformer monitoring system to detect and monitor random failures in a Low Tension (LT) distribution transformers due to improper usage and poor maintenance. The embodiments herein achieve this by implementing an intelligent transformer monitoring system for a Low Tension (LT) distribution transformer to prevent the LT transformer from failures by acquiring a time domain measurement and correlating acquired parameters and processing statistical analysis methods. The embodiments herein further provide proactively alerting the maintenance personnel of geographically nearby location for quick corrective actions using the GPS location of the Low Tension (LT) distribution transformer to prevent failures. Referring now to the drawings, and more particularly to FIGS. 1 to 5, where similar reference characters denote corresponding features consistently throughout the figures, there are shown preferred embodiments.

FIG. 1 is a block diagram that illustrates an intelligent transformer monitoring system according to some embodiments herein. The block diagram includes the intelligent transformer monitoring system ITMS 102, a Low Tension (LT) distribution transformer 104, a GSM-GPRS link 110, (measurement and instrumentation module, a control relay module, a Trivector energy measurement and GPS reception are part of the ITMS 102), GPS 108, a user device 112, a server 114, a network operations center NOC network management system NMS server 116, and a SMS alert 118. The intelligent transformer monitoring system 102 compares an instantaneous parametric data acquired with threshold levels defined and the parametric data is preloaded based on a capacity of the Low Tension (LT) distribution transformer 104 and the Low Tension (LT) distribution transformer 104 manufactured specifications. The intelligent transformer monitoring system 102 sets various alarm levels and alerts a designated maintenance personnel for necessary actions to be taken. The intelligent transformer monitoring system 102 further provides instant messages to the user on at least one of (i) total power failure, (ii) phase failure, (iii) overload, (iv) over voltage, (v) under voltage, (vi) over temperature, or (vii) Low Power Factor Alert.

Figure 2:
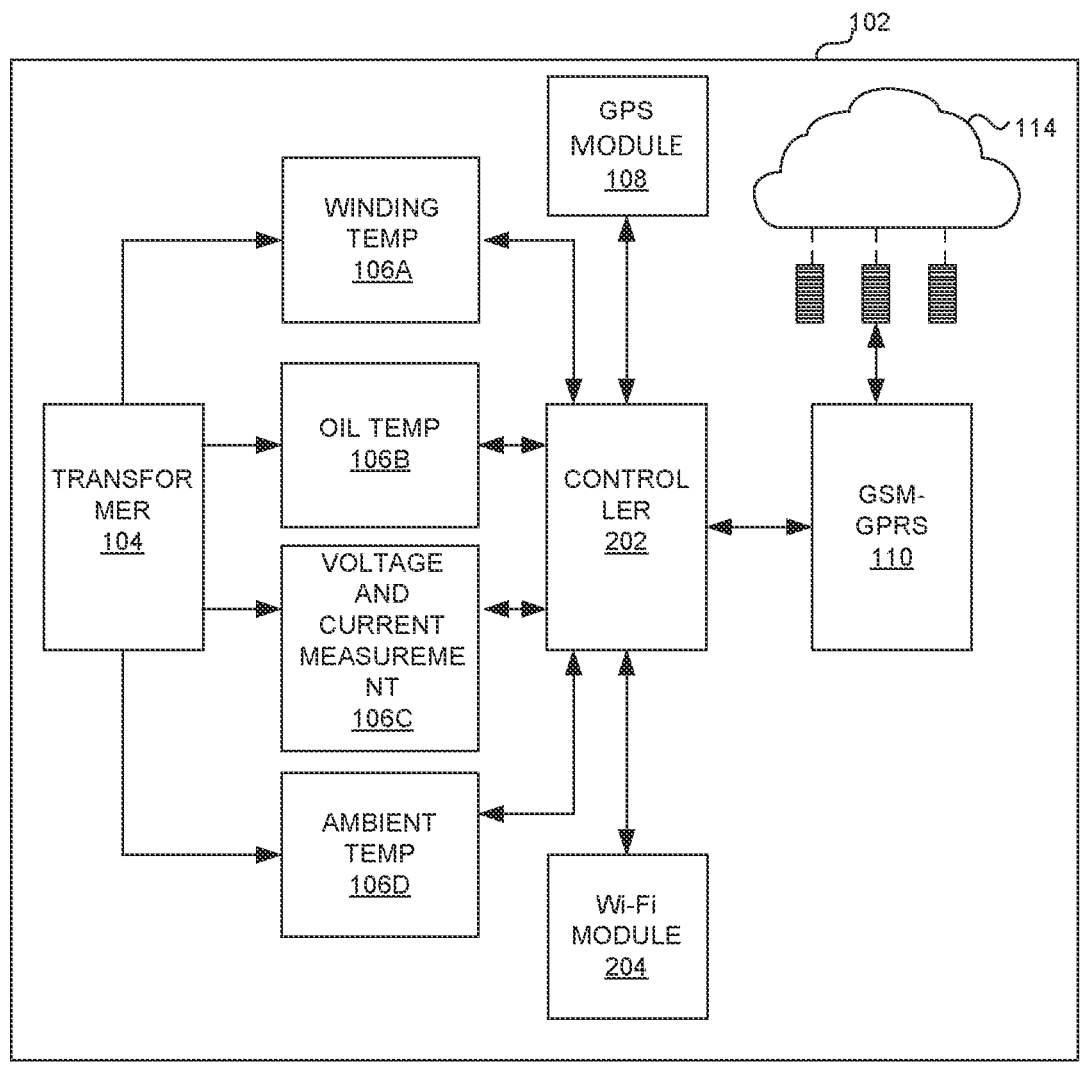
FIG. 2 is a block diagram that illustrates an exploded view of the intelligent transformer monitoring system according to some embodiments herein.

FIG. 2 is a block diagram that illustrates an exploded view of the intelligent transformer monitoring system according to some embodiments herein. The intelligent transformer monitoring system 102 includes sensors 106 A-D, a Low Tension (LT) distribution transformer 104, GPS 204, a controller 202, GSM-GPRS 110 AND server 114. The sensors 106A-D includes a winding temp 106A, an oil temp 106B, a voltage and current measurement 106C, and ambient temp 106D. The winding temp 106A is mounted on three-phase winding output terminals of the Low Tension (LT) distribution transformer 104. The Low Tension (LT) distribution transformer 104. The oil temp 106B is mounted at top of an oil level through an oil monitoring pocket provided on the transformer 104. The intelligent transformer monitoring system 102 compares a live data acquired from sensors 106A-D with a parametric data which is preloaded based on a capacity of the Low Tension (LT) distribution transformer 104 and manufactured specifications of the Low Tension (LT) distribution transformer 104. The live data is an instantaneous parametric data acquired with threshold levels from the sensors 106A-D. The intelligent transformer monitoring system 102 sets various alarm levels and alerts a designated maintenance personnel for necessary actions to be taken. The intelligent transformer monitoring system 102 further provides instant messages to a user on at least one of (i) total power failure, (ii) phase failure, (iii) overload, (iv) over voltage, (v) under voltage, (vi) over temperature, or (vii) Low Power Factor Alert. In one embodiment, the mentioned conditions are considered as an improper usage of the Low Tension (LT) distribution transformer 104. The Low Power Factor Alert is of value one, if the live data of the lower power factor is less than one then the intelligent transformer monitoring system 102 alerts the user. In an embodiment, the intelligent transformer monitoring system 102 also includes a Power Supply, and a Battery backup. The GSM-GPRS 110 is used to establish communication between a computer and a GSM-GPRS system. Global System for Mobile communication (GSM) is an architecture used for mobile communication in most of the countries. Global Packet Radio Service (GPRS) is an extension of GSM that enables higher data transmission rate. The GSM-GPRS 110 includes a microcontroller along with GSM_GPRS modem in order to execute remote communication on the GSM-GPRS 110. The microcontroller is interfaced with modules with serial communication and extends the communication with in the intelligent transformer monitoring system 102. In one embodiment, the GSM-GPRS 110 includes built in hardware and software features. In another embodiment, a hardware features of the GSM-GPRS 110 includes a SIM800 Quad band modem such as Quad band modem (850/900/1800, 1900 MHz GSM GPRS), TCPIP stack with Realtime clock with battery backup and a Microcontroller such as Renesas R8c/2B.

In yet another embodiment, a software features of the GSM-GPRS 110 includes the GSM Modem, a Wi-Fi Modem, a Measurement instrumentation, a Trivector meter reading, an electrically erasable programmable read-only memory EEPROM events and data updating, a GPS Module, and a Wi-Fi Module. The GSM includes Sim detection, Connection updating, Communication to controller, Communication on GPRS to server 114 and SMS module. The Wi-Fi module 204 includes an authentication, a connection updating, a communication to controller, a communication on Wi-Fi module 204 to server 114 and the user device 112. The measurement and instrumentation module includes a temperature reading, a calibration and measurement data updating on RS485/WIFI. The Trivector meter reading includes Vrms, Irms, Energy reading, Calibration and SPI communication. The EEPROM events & data updating includes configuration parameters storage, and Eventlogigng, The GPS Module 108 includes a longitude, a latitude and a Coordinated Universal Time UTC. The WIFI Module 204 incudes Data display through App and Server update.

The measurement and instrumentation module includes eleven temperature measurement channels with 8-digital temperature sensors and 3—Resistance Temperature Detectors RTD. A digital temperature is a one wire bus communication and the digital temperature measures a temperature with 0.25 resolution. An in-built controller of RTD samples the temperature equivalent voltage and converts into the temperature with resolution of 0.1 centigrade degrees. The controller 202 updates the measured temperature as per master sampling rate. The temperature channels include a LT Winding temperature, an Oil top temperature, an Oil middle temperature, an Oil bottom temperature, an Ambient Temperature, and a spare.

The control relay module includes 4 SPDT relays to exercise output controls such as a load trip and a cooling motor. All three connections are normally open NO, normally closed NC and Common are terminated to terminal blocks. The Tri vector energy measurement measures the LT side 230V ac distributed line energy, a voltage and a current with 1% accuracy to estimate the load trips and consumption on output of the Low Tension (LT) distribution transformer 104. The Low Tension (LT) distribution transformer 104 also includes a LED module. The LED module includes 4 LED's with an extendable provision. The GPS module 108 acquires the latitude, longitude and a time data from a satellite for location sharing of the Low Tension (LT) distribution transformer 104 with the intelligent transformer monitoring system 102. The time data is acquired and processed by the microcontroller for internal timing as well as time tagging of the live data sent to the server 114. The Wi-Fi module 204 works as a local server and sends the live data to the app browser whenever the user requests the GPS module 108. The GPS module 108 updates the live data to the server if module has internet connectivity instead of GSM-GPRS 110. The Power supply module is an AC or DC SMPS power supply to convert 240V/415V AC to 12 VDC for the intelligent transformer monitoring system 102. Other voltages are derived from onboard switching regulators and linear regulators. A battery charger may charge a 2000 mAH Li-Ion/7 AH sealed Led acid battery from AC input and the same battery output is connected (Ored) to the power supply module to generate a regulated voltages for sub module usage.

The intelligent transformer monitoring system 102 monitors and provides online status reports using the live data. The live data is the instant parametric data acquired through winding temp sensor 106A and measurement of electrical parameters (Voltage, Load Current, KWH, KVAH, and Load Power factor monitoring module). The intelligent transformer monitoring system 102 further monitors variables such as an energy used from grid, a Load Factor, and temperatures of individual windings of the Low Tension (LT) distribution transformer 104, top of the oil, the Low Tension (LT) distribution transformer body and ambient temperature. The intelligent transformer monitoring system 102 communicates via the GSM-GPRS 110, WIFI module 204 to the (NOC) Network Operations Center 116. In an embodiment, the intelligent transformer monitoring system 102 includes a cloud Server based Monitoring software, a Realtime data analytics and a predictive analytical algorithm. The cloud Server based Monitoring software, the Realtime data analytics and the predictive analytical algorithm are used to help determine a possible outcomes of various health parameter of the Low Tension (LT) distribution transformer 104 such as a Life cycle—warranty, a Maintenance Cycle and also helps to determine the Predictive Load by accumulating data from an area, a Sub-station, a District, and the like. All communication between the intelligent transformer monitoring system 102 and the user is through GPRS or IP and through GSM SMS packets. In an embodiment, the intelligent transformer monitoring system 102 includes the live data. The live data automatically generates an alarm alerts, a visual alerts, and reports and directly sends the alarm alerts, the visual alerts, and the reports to the user through SMS from a site of the Low Tension (LT) distribution transformer 104. A Real time clock alarm records event and entire Data logging facility. The Real time clock alarm also does Fault analysis, recognition and reporting to a field personnel and the NOC NMS server 116. The intelligent transformer monitoring system 102 minimizes the Low Tension (LT) distribution transformer 104 downtime, maximizes the Low Tension (LT) distribution transformer 104 life, Maximizes equipment performance and throughput. Minimizes Operational and Maintenance costs.

Figure 3:
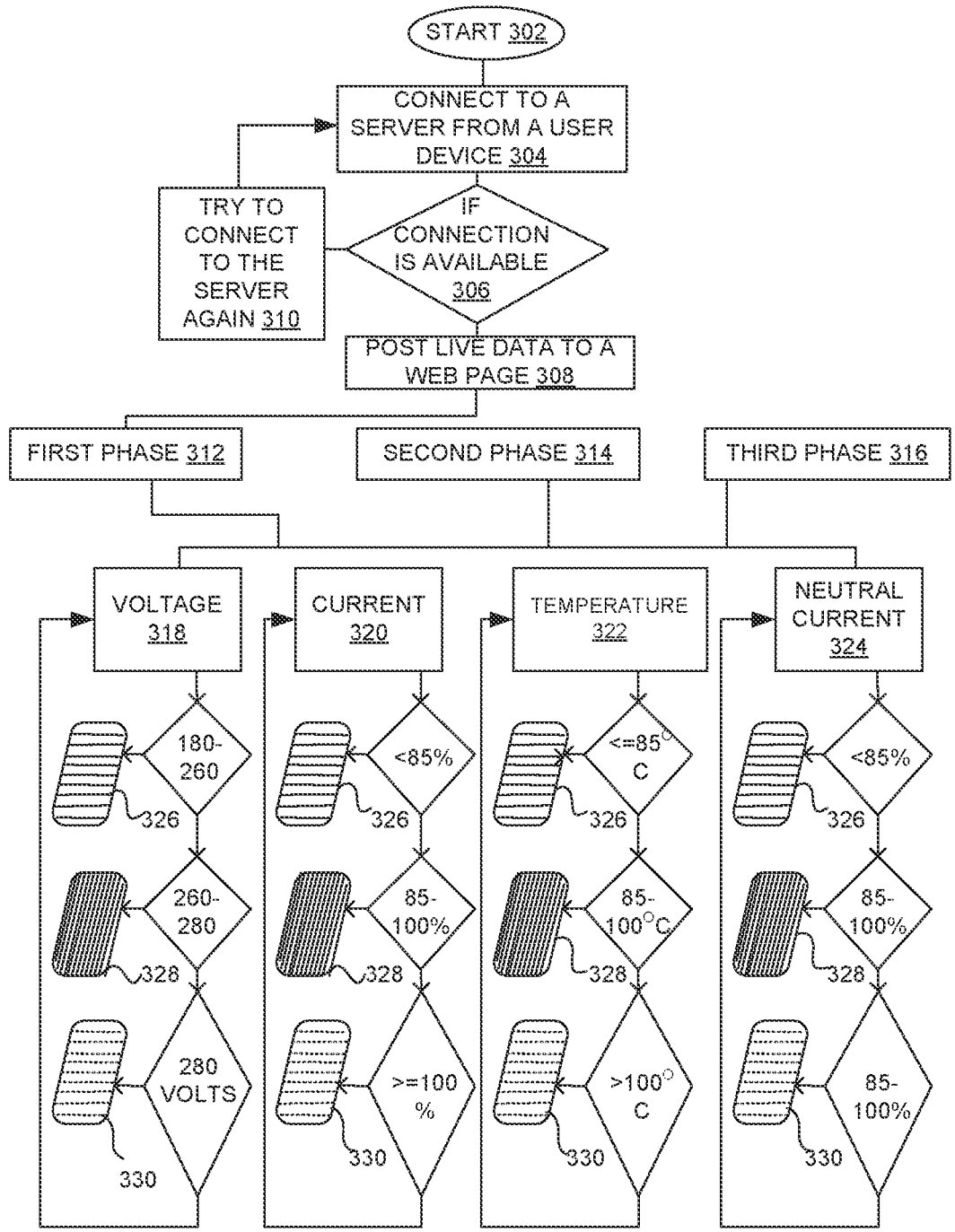
FIG. 3 is a process flow diagram that illustrate a method of analysis in the intelligent transformer monitoring system according to some embodiments herein.

FIG. 3 is process flow diagram that illustrates a method of analyzing a live data captured from one or more sensors of a low tension (LT) distribution transformer according to some embodiments herein. At step 302, the method starts analyzing a live data captured from one or more sensors 106A-D of the low tension (LT) distribution transformer 104. At step 304, a user device 112 tries to connect to a server 114. At step 306, the user device 112 checks if the connection to the server 114 is available or not. If the connection is available then the method moves to step 308 else to step 310. At step 308, the live data is posted on a web page. At step 310, the user device 112 tries again to connect to the server 114. In some embodiment, the intelligent transformer monitoring system 102 analysis the live data in three phases and provides the visual alerts on abnormalities of the low tension (LT) distribution transformer 104 through the web page to the user. The three phases includes a first phase 312, a second phase 314, and a third phase 316. The three phases monitors at least one of (i) a voltage 318, (ii) a current 320, (iii) a temperature 322, and (iv) a neutral current 324 against a threshold value. The visual alerts includes color alerts in form of a white color, an amber or an orange color, and a red color. The white color represents a horizontal lines 326. The yellow color represents a vertical lines 328. The red color represents a dotted lines 330. In an embodiment, the white color indicates a normal condition of the low tension (LT) distribution transformer 104 against the threshold value. The amber or the orange color indicates a medium priority of an error alert of the low tension (LT) distribution transformer 104 against the threshold value. The red color indicates a high priority of the error alert of the low tension (LT) distribution transformer 104 against the threshold value. The high priority alert is sent to the user in a form of a message to the user device.

In an example embodiment, The visual alert of the white color is notified to the user when the at least one of (i) the voltage 318 is at 180-260 volts against the threshold value, (ii) the current 320 is at <85% against the threshold value, (iii) the temperature 322 is <=85° C. against the threshold value, and (iv) the neutral current 324 is <85% against a threshold value. In another example embodiment, The visual alert of the amber or the orange color is notified to the user when the at least one of (i) the voltage 318 is at 260-280 volts against the threshold value, (ii) the current 320 is at 85-100% against the threshold value, (iii) the temperature 322 is 85-100° C. against the threshold value, and (iv) the neutral current 324 is 85-100% against a threshold value. In yet another example embodiment, The visual alert of the red color is notified to the user when the at least one of (i) the voltage 318 is at 280 volts and above against the threshold value, (ii) the current 320 is at >=100% against the threshold value, (iii) the temperature 322 is >100° C. against the threshold value, and (iv) the neutral current 324 is 85-100% against a threshold value.

Figure 4:
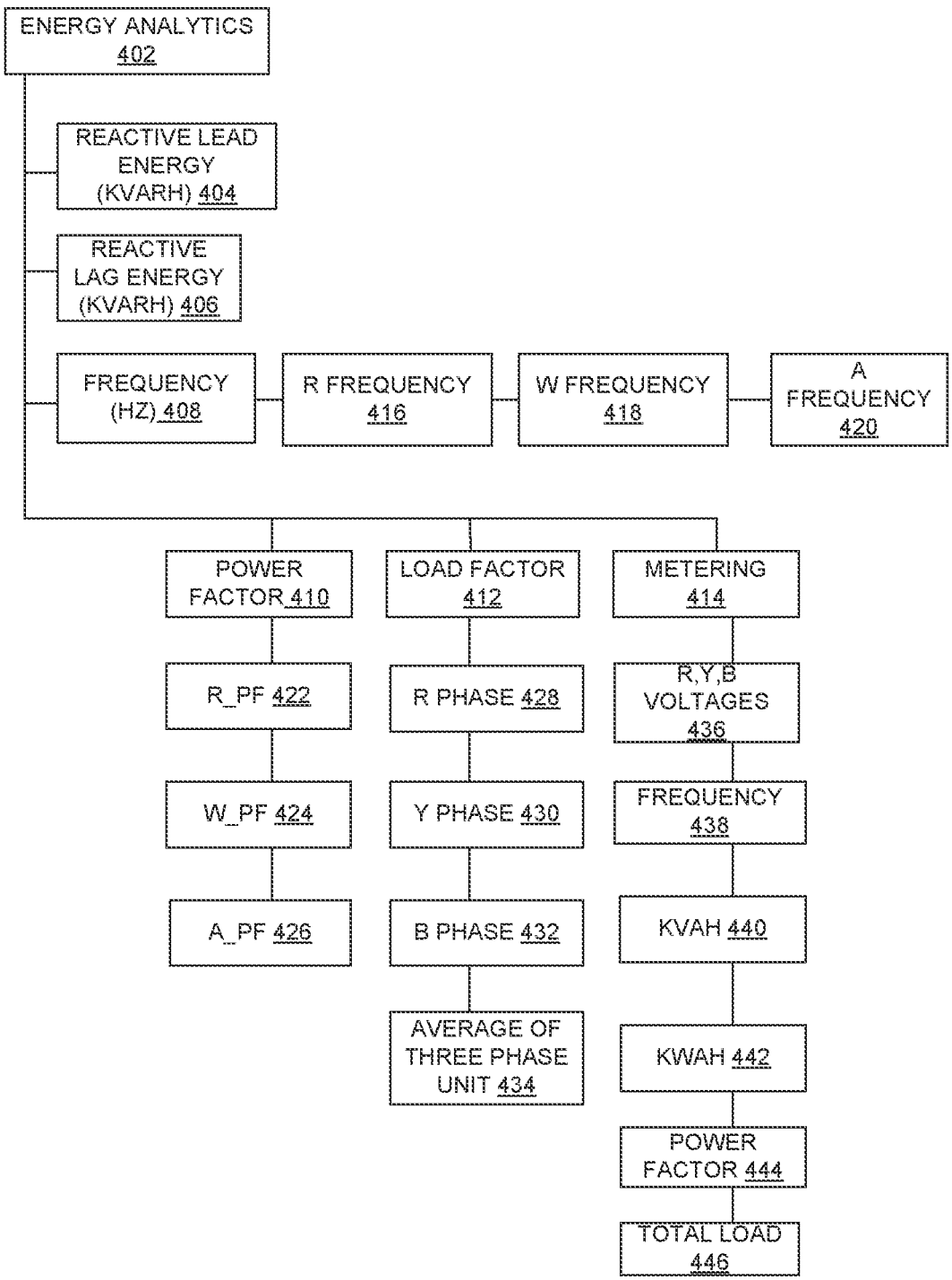
FIG. 4 is a block diagram that illustrates a device for measuring a power factor of the intelligent transformer monitoring system according to some embodiments herein.

FIG. 4 is a block diagram that illustrates a device for measuring a power factor of the intelligent transformer monitoring system according to some embodiments herein. The device includes an ENERGY Analytics 402, a Reactive Lead energy (Kilo Volt Amperes Reactive Hours KVARH) 404, a Reactive lag energy (Kilo Volt Amperes Reactive Hours KVARH) 406, a frequency (HZ) 408, the power factor 410, a load factor 412, and a metering 414. The frequency (HZ) 408 includes a Red R frequency 416, a white W frequency 418, and an amber A frequency 420. In an embodiment, the Red R frequency 416 represents a frequency range of below 45 HZ and above 55 HZ, the white W frequency 418 represents a frequency range of 45 HZ to 53 HZ, and the amber A frequency 420 represents a frequency range of 45 HZ to 47 HZ. The power factor includes a red power factor R_PF 422, a white power factor Y_PF 424, and an amber power factor B_PF 426. In an embodiment, the red power factor R_PF 422 represents a power factor range of 0.8 or below 0.8, the white power factor Y_PF 424 represents a power factor range of 0.95 and above, and the amber power factor B_PF 426 represents a power factor range of 0.8>0.95. The load factor 412 is a three phase. The three phase is color coded. The three phase includes a red R phase 428, a yellow Y phase 430, and a blue B phase 432. An average of the red R phase 428, the yellow Y phase 430, and the blue B phase 432 is calculated at an average of three phase unit 434. The metering 414 measures a R, Y, B voltages 436, a frequency 438, a Kilo Volt Ampere Hours KVAH 440, a KWAH 442, a power factor 444, and a total load 446. The KVAH 440 includes a lag load and a lead load. The power factor 410 is defined as the ratio of real power to apparent power. The energy 402 is transferred along a transmission line, it does not consist purely of real power that can do work once transferred to the load, but rather consists of a combination of real and reactive power, called apparent power.

The power factor 410 describes the amount of real power transmitted along a transmission line relative to the total apparent power flowing in the line. There is also a difference between the Reactive Lead energy (Kilo Volt Amperes Reactive Hours KVARH) 404, and the Reactive lag energy (Kilo Volt Amperes Reactive Hours KVARH) 406. The terms refer to whether the phase of the current is leading or lagging the phase of the voltage. A lagging power factor signifies that the load is inductive, as the load will "consume" reactive power, and therefore the reactive component is positive as reactive power travels through the circuit and is "consumed" by the inductive load. A leading power factor signifies that the load is capacitive, as the load "supplies" reactive power, and therefore the reactive component is negative as reactive power is being supplied to the circuit. The power factor 410 is by definition a dimensionless number between −1 and 1. When power factor 410 is equal to 0, the energy flow is entirely reactive and stored energy in the load returns to the source on each cycle. When the power factor 410 is 1, all the energy supplied by the source is consumed by the load. The power factor 410 are usually stated as "leading" or "lagging" to show the sign of the phase angle. Capacitive loads are leading (current leads voltage), and inductive loads are lagging (current lags voltage).

If a purely resistive load is connected to a power supply, current and voltage will change polarity in step, the power factor 410 will be 1, and the electrical energy flows in a single direction across the network in each cycle. Inductive loads such as induction motors (any type of wound coil) consume reactive power with current waveform lagging the voltage. Capacitive loads such as capacitor banks or buried cable generate reactive power with current phase leading the voltage. Both types of loads will absorb energy during part of the AC cycle, which is stored in the device's magnetic or electric field, only to return this energy back to the source during the rest of the cycle.

For example, to get 1 kW of real power, if the power factor 410 is unity, 1 kVA of apparent power needs to be transferred (1 kW÷1=1 kVA). At low values of power factor 410, more apparent power needs to be transferred to get the same real power. To get 1 kW of real power at 0.2 power factor, 5 kVA of apparent power needs to be transferred (1 kW÷0.2 15=5 kVA). This apparent power must be produced and transmitted to the load, and is subject to the losses in the production and transmission processes.

Electrical loads consuming alternating current power consume both real power and reactive power. The vector sum of real and reactive power is the apparent power. The presence of reactive power causes the real power to be less than the apparent power, and so, the electric load has a power factor 410 of less than 1.

A negative power factor (0 to −1) can result from returning power to the source, such as in the case of a building fitted with solar panels when surplus power is fed back into the supply. In practice, the local effects of distortion current on devices in a three-phase distribution network rely on the magnitude of certain order harmonics rather than the total harmonic distortion.

For example, the triplen, or zero-sequence, harmonics (3rd, 9th, 15th, etc.) have the property of being in-phase when compared line-to-line. In a delta-wye transformer, these harmonics can result in circulating currents in the delta windings and result in greater resistive heating. In a wye-configuration of a Low Tension (LT) distribution transformer 104, triplen harmonics will not create these currents, but they will result in a non-zero current in the neutral wire. This could overload the neutral wire in some cases and create error in kilowatt-hour metering systems and billing revenue. The presence of current harmonics in the Low Tension (LT) distribution transformer 104 also result in larger eddy currents in the magnetic core of the Low Tension (LT) distribution transformer 104. Eddy current losses generally increase as the square of the frequency, lowering the Low Tension (LT) distribution transformer's efficiency, dissipating additional heat, and reducing its service life.

Negative-sequence harmonics (5th, 11th, 17th, etc.) combine 120 degrees out of phase, similarly to the fundamental harmonic but in a reversed sequence. In generators and motors, these currents produce magnetic fields which oppose the rotation of the shaft and sometimes result in damaging mechanical vibrations. The power factors below 1.0 require a utility to generate more than the minimum volt-amperes necessary to supply the real power (watts). This increases generation and transmission costs. For example, if the load power factor were as low as 0.7, the apparent power would be 1.4 times the real power used by the load. Line current in the circuit would also be 1.4 times the current required at 1.0 power factor, so the losses in the circuit would be doubled (since they are proportional to the square of the current). Alternatively, all components of the system such as generators, conductors, the Low Tension (LT) distribution transformers, and switchgear would be increased in size (and cost) to carry the extra current. When the power factor is close to unity, for the same KVA rating of the Low Tension (LT) distribution transformer 104 more load can be connected.

Figure 5:
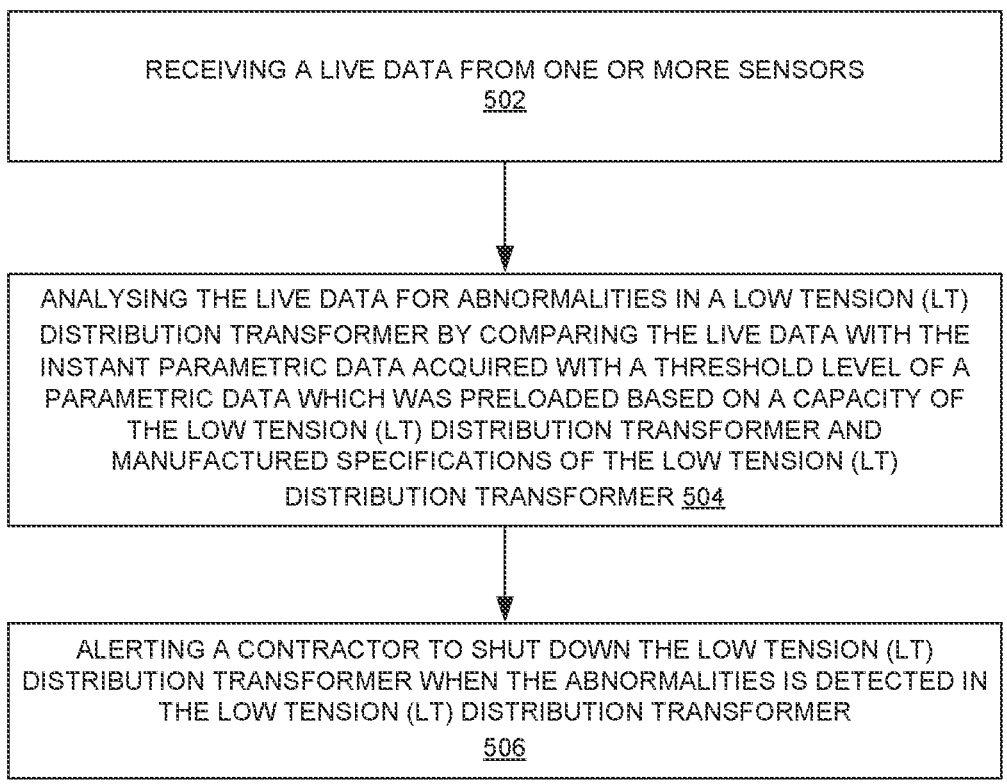
FIG. 5 illustrates a method for providing the intelligent transformer monitoring system according to some embodiment herein.

FIG. 5 illustrates a method for providing the intelligent transformer monitoring system according to some embodiment herein. At step 502, a real-time data is received from one or more sensors 106A-D. The one or more sensors 106A-D includes a winding temperature sensor 106A, an oil temperature sensor 106B, a voltage and current measurement sensor 106C, and an ambient temperature sensor 106D. At step 504, the live data is analyzed for abnormalities in the low tension (LT) distribution transformer 104 by comparing the live data with the instant parametric data acquired with a threshold level of a parametric data which was preloaded based on a capacity of the low tension (LT) distribution transformer 104 and manufactured specifications of the low tension (LT) distribution transformer 104. At step 506, a contractor is alerted to shut down the low tension (LT) distribution transformer 104 when the abnormalities is detected in the low tension (LT) distribution transformer 104.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope.

What is claimed is:

1. An intelligent transformer monitoring system, the system comprising:
    one or more sensors that is communicatively connected to a low tension (LT) distribution transformer and is configured to capture live data of the low tension (LT) distribution transformer, wherein the one or more sensors comprises a winding temperature sensor, an oil temperature sensor, a voltage and current measurement sensor, and an ambient temperature sensor, wherein the live data is an instant parametric data acquired from the one or more sensors and a measurement of an electrical parameters of the low tension (LT) distribution transformer, wherein the low tension (LT) distribution transformer is configured to couple with the winding temperature sensor, wherein the winding temperature sensor captures the live data, wherein the oil temperature sensor is mounted on the top of an oil level through an oil monitoring pocket provided on the low tension (LT) distribution transformer;
    a Global System for Mobile Communications GSM—general packet radio services (GSM-GPRS) modem that comprises a microcontroller along with a GSM-GPRS modem for establishing a remote communication to transmit the live data between the GSM-GPRS modem and a global positioning system (GPS) module of the low tension (LT) distribution transformer, wherein the global positioning system (GPS) module characterized in that comprises a measurement and instrumentation module that is configured to acquire a positional information comprising a longitude and a latitude coordinates, and a time data of the low tension (LT) distribution transformer, wherein the acquired longitude and latitude coordinates, and the time data is processed for an internal timing and a time tagging of the live data;
    a server that receives the live data with an exact positional information of the low tension (LT) distribution transformer based on a GPS module of the low tension (LT) distribution transformer;
    a Wi-Fi module that is configured as a local server, wherein the Wi-Fi module acquires the live data from the one or more sensors and transmits the live data to an application browser on a user device when a user requests the intelligent transformer monitoring system for the live data of the low tension (LT) distribution transformer; and
    a control relay module that comprises a single pole double throw (SPDT) relays to control a load trip and a cooling motor of the low tension (LT) distribution transformer based on the live data.

2. The intelligent transformer monitoring system of claim 1, wherein the intelligent transformer monitoring system compares the instant parametric data acquired with a threshold level of a parametric data which was preloaded based on a capacity of the low tension (LT) distribution transformer and manufactured specifications of the low tension (LT) distribution transformer.

3. The intelligent transformer monitoring system of claim 1, wherein the measurement and instrumentation module measures a temperature reading, a calibration, and a measurement of the live data associated with the low tension (LT) distribution transformer.

4. The intelligent transformer monitoring system of claim 3, wherein the calibration includes one or more parameters comprising at least one of: the temperature, a voltage, and a current associated with the low tension (LT) distribution transformer.

5. The intelligent transformer monitoring system of claim 1, wherein the intelligent transformer monitoring system comprises a controller for updating the measured temperature of the low tension (LT) distribution transformer as per a master sampling rate.

6. The intelligent transformer monitoring system of claim 1, wherein the measurement and instrumentation module comprises a temperature measurement channels with a digital temperature sensors and a resistance temperature detector (RTD).

7. The intelligent transformer monitoring system of claim 1, wherein the temperature measurement channels comprises a LT winding temperature, an oil top temperature, an oil middle temperature, an oil bottom temperature, an ambient temperature, and a spare.

8. The intelligent transformer monitoring system of claim 1, wherein intelligent transformer monitoring system is configured to automatically generate an alarm alert, a visual alert, and a report to be sent to the user through a short message service SMS from a site of the low tension (LT) distribution transformer.

\* \* \* \* \*